US 7,242,330 B2

(12) United States Patent
Alter

(10) Patent No.: US 7,242,330 B2
(45) Date of Patent: Jul. 10, 2007

(54) DYNAMIC COMPENSATION OF ANALOG-TO-DIGITAL CONVERTER (ADC) OFFSET ERRORS USING FILTERED PWM

(75) Inventor: David Michael Alter, Burlington, MA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/738,870

(22) Filed: Dec. 17, 2003

(65) Prior Publication Data

US 2005/0134488 A1 Jun. 23, 2005

(51) Int. Cl.
*H03M 1/12* (2006.01)
(52) U.S. Cl. ......................... 341/118; 341/152; 341/120
(58) Field of Classification Search ................ 341/118, 341/120, 152; 329/312
See application file for complete search history.

(56) References Cited

U.S. PATENT DOCUMENTS

| 3,246,247 | A | * | 4/1966 | Grindle ........................ 327/31 |
|---|---|---|---|---|
| 4,337,456 | A | | 6/1982 | Deffendall et al. ..... 340/347 NT |
| 4,364,028 | A | | 12/1982 | Masuda et al. ........ 340/347 NT |
| 4,380,005 | A | | 4/1983 | Debord et al. ......... 340/347 NT |
| 4,542,354 | A | * | 9/1985 | Robinton et al. ........... 341/118 |
| 4,547,763 | A | | 10/1985 | Flamm .................. 340/347 CC |
| 4,766,417 | A | * | 8/1988 | Takayama et al. .......... 341/118 |
| 4,965,867 | A | * | 10/1990 | Tsuchida et al. ............ 341/118 |
| 5,121,119 | A | * | 6/1992 | Higuchi et al. ............. 341/120 |
| 5,122,800 | A | * | 6/1992 | Philipp ....................... 341/164 |
| 5,523,756 | A | * | 6/1996 | Mariuz et al. .............. 341/118 |
| 5,724,035 | A | * | 3/1998 | Sakuma ...................... 341/120 |
| 6,069,808 | A | | 5/2000 | Panahi et al. ................ 363/98 |
| 2002/0149505 | A1 | * | 10/2002 | Kanno ........................ 341/152 |

FOREIGN PATENT DOCUMENTS

| JP | 57181223 A | * | 11/1982 |
|---|---|---|---|
| JP | 04354931 A | * | 12/1992 |

OTHER PUBLICATIONS

Alter, Using PWM Output as a Digital-to-Analog Converter on a TMS320C240 DSP, Texas Instruments, Application Report SPRA490, Nov. 1998.*

(Continued)

*Primary Examiner*—Howard L. Williams
(74) *Attorney, Agent, or Firm*—Wade J. Brady, III; Frederick J. Telecky, Jr.

(57) ABSTRACT

A system and method of dynamic offset compensation that is particularly adaptable to analog-to-digital conversion performed in control applications employing highly integrated Digital Signal Processor (DSP) devices. The system providing dynamic compensation of Analog-to-Digital Converter (ADC) zero level offset errors includes an integrated DSP device with a multi-bit ADC and a PWM waveform generator for producing at least one PWM output, and an external low pass filter. The ADC receives an analog input signal and converts it into a corresponding digital output signal. The DSP device measures the zero level offset of the ADC output signal, and dynamically controls characteristics of the PWM output based on the measured offset. The low pass filter receives the PWM output and applies a corresponding controlled DC output voltage to the low reference voltage input of the ADC to dynamically compensate for the zero level offset error.

20 Claims, 3 Drawing Sheets

OTHER PUBLICATIONS

Schoofs, Bipolar Voltage Outputs for the TLV56xx Family of DACS, Texas Instruments Application Report SLAA113, Dec. 2000.*

Data Manual—TMS320F2810-TMS320F2812, TMS320C2810-TMS320C2812 Digital Signal Processors; Texas Instruments, Apr. 2001—Revised Dec. 2003.

* cited by examiner

DYNAMIC COMPENSATION OF ANALOG-TO-DIGITAL CONVERTER (ADC) OFFSET ERRORS USING FILTERED PWM

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

The present application relates generally to analog-to-digital converters, and more specifically to systems and methods of dynamically compensating for zero level offset errors introduced into output signals generated by analog-to-digital converters. The presently disclosed system and method of dynamic offset compensation is particularly adaptable to analog-to-digital conversion performed in control applications employing highly integrated digital signal processor devices.

It is well known that output signals generated by Analog-to-Digital Converters (ADCs) frequently include unwanted DC voltage components that cause zero level offsets to be present in the signals. For example, an ADC output signal may have a positive zero level offset or a negative zero level offset. Such zero level offsets are often sources of error, especially when the output signal level is low. In general, the zero level offset error of an analog-to-digital converter is defined as the non-zero digital conversion of a 0 volt analog input signal. Ideally, the digital conversion of a 0 volt analog signal is a 0 volt digital signal.

Conventional analog-to-digital converters typically include a high reference voltage pin (e.g., REF+) and a low reference voltage pin (e.g., REF−) having respective high and low reference voltages (e.g., $V_{ref+}$ and $V_{ref-}$) applied thereto. Analog input voltage levels greater than $V_{ref+}$ are normally converted by an ADC to a digital signal represented by all ones (e.g., 11111111), and analog input voltage levels less than $V_{ref-}$ are normally converted by an ADC to a 0 volt digital signal represented by all zeros (e.g., 00000000). In this case, it is assumed that the analog-to-digital converter is an 8-bit ADC. To determine the zero level offset error for such an ADC, an analog voltage level (DC) is typically applied to the REF− pin corresponding to the level that should be converted by the ADC to 0 volts. Next, this same voltage level is applied to the input of the ADC, and the positive zero level offset error is determined by taking the difference between the actual non-zero ADC output and the expected 0 volt ADC output. In the event the ADC has a negative zero level offset error, the highest input analog voltage level is determined that causes the ADC to generate a 0 volt digital output. This voltage level is then converted into equivalent bits to determine the negative offset error.

One way of compensating for zero level offset errors in analog-to-digital converters is to apply a fixed non-zero analog voltage level to the low reference voltage pin, REF−. For example, a suitable fixed voltage level may be applied to the REF− pin to compensate for a pre-defined worst-case offset error. However, this compensation technique has drawbacks in that it does not reduce the range of the ADC offset error, but merely shifts the range of the offset error. For example, an ADC may exhibit an offset error of ±80 LSB (offset error range of 160 LSB). In the event a voltage level corresponding to 80 LSB were applied to the low reference voltage pin of the ADC, the range of the ADC offset error would typically shift from ±80 LSB to 0–160 LSB without reducing the offset error range. In addition, this compensation technique fails to take into account; potential long-term changes in offset currents and voltages, which can cause variations in the range of the offset error.

Another known technique to compensate for zero level offset errors in ADCs is to apply a dynamically controlled analog voltage level to the low reference voltage pin, REF−. For example, a conventional dynamic zero level offset compensating system may include programmable Digital Signal Processor (DSP) circuitry coupled to a Digital-to-Analog Converter (DAC) for generating an analog voltage level dynamically controlled by the DSP circuitry. Because the DSP circuitry is programmable, dynamic compensation for variations in the ADC circuitry may be performed via software during system operation. However, this technique of dynamically compensating for zero level offset errors also has drawbacks in that it can be very costly to implement.

Instead of using a dedicated digital signal processor to implement dynamic compensation of ADC offset errors, an integrated digital signal processor device including DSP circuitry and a multi-bit ADC may be employed. For example, the TMS320F2812 Digital Signal Processor manufactured by Texas Instruments® Inc., Dallas, Tex., USA, includes DSP circuitry and a 12-bit ADC module. To dynamically compensate for zero level offset errors in the 12-bit ADC of the TMS320F2812 device, an external DAC device may be employed to convert a digital control voltage generated by the DSP circuitry into a corresponding controlled analog voltage, which may then be applied to the low reference voltage input of the integral 12-bit ADC. However, this technique of dynamically compensating for ADC offset errors can also be costly to implement.

It would therefore be desirable to have a system and method of dynamically compensating for ADC offset errors that avoids the drawbacks of the above-described conventional techniques.

BRIEF SUMMARY OF THE INVENTION

In accordance with the present invention, a system and method of dynamic offset compensation is disclosed that is particularly adaptable to analog-to-digital conversion performed in control applications employing highly integrated Digital Signal Processor (DSP) devices. Benefits of the presently disclosed dynamic offset compensation technique are achieved by generating a dynamic low reference voltage signal using at least one Pulse-Width Modulated (PWM) output of the integrated DSP device.

In one embodiment, a system providing dynamic compensation of Analog-to-Digital Converter (ADC) zero level offset errors comprises an integrated DSP device including a multi-bit ADC module and a PWM waveform generator for producing at least one PWM output, and an external low pass filter. The ADC module is configured to receive an analog input signal, and to convert the analog input signal into a corresponding digital output signal. The DSP device is programmable for periodically detecting the zero level offset of the ADC output signal, and for dynamically controlling characteristics of the PWM output based on the detected zero level offset. The low pass filter is configured to receive the PWM output, and to provide a corresponding dynamically controlled DC output voltage, which is applied to the low reference voltage input of the ADC module to compensate for the zero level offset error. Because the PWM output is a positive voltage, directly filtering the PWM output by the low pass filter produces a positive DC output voltage, which may be employed to compensate for positive zero level offset errors. In the event a negative DC output voltage is required to compensate for a negative zero level offset error, the PWM output is applied to an external comparator to generate a bipolar PWM output, which is subsequently filtered by the low pass filter to produce the desired negative DC output voltage. By applying this negative DC output voltage to the low reference voltage input of the ADC module, dynamic compensation can be achieved for negative zero level offset errors.

By generating a dynamically controllable DC voltage signal from at least one PWM output of a highly integrated DSP device, dynamic compensation of positive and negative zero level offset errors introduced into an ADC output signal can be obtained at reduced cost.

Other features, functions, and aspects of the invention will be evident from the Detailed Description of the Invention that follows.

BRIEF DESCRIPTION OF THE SEVERAL VIEWS OF THE DRAWINGS

The invention will be more fully understood with reference to the following Detailed Description of the Invention in conjunction with the drawings of which.

DETAILED DESCRIPTION OF THE INVENTION

A system and method of providing dynamic compensation of Analog-to-Digital Converter (ADC) zero level offset errors is provided that is adaptable to analog-to-digital conversion performed in control applications employing highly integrated Digital Signal Processor (DSP) devices. The presently disclosed dynamic compensation technique employs a filtered Pulse-Width Modulated (PWM) signal as a DC control voltage, which is applied to the low reference voltage input of an ADC to achieve the desired dynamic offset compensation.

Figure 1:
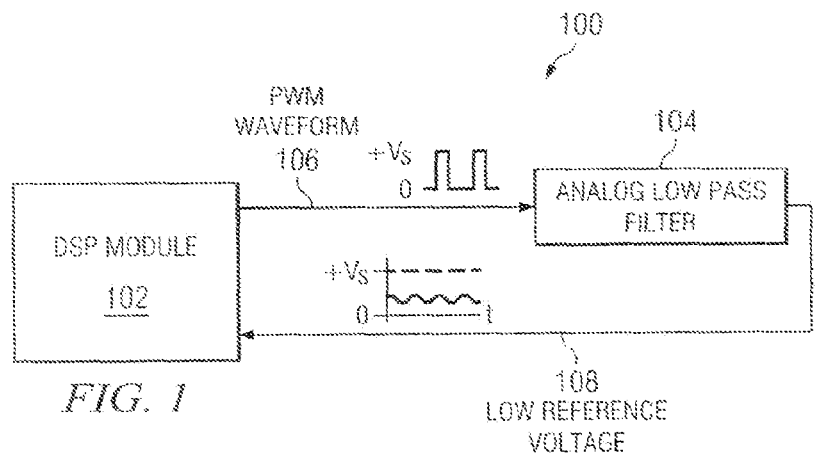
FIG. 1 is a block diagram of a system providing dynamic compensation of analog-to-digital converter zero level offset errors according to the present invention.

FIG. 1 depicts an illustrative embodiment of a system 100 providing dynamic compensation of Analog-to-Digital Converter (ADC) zero level offset errors, in accordance with the present invention. In the illustrated embodiment, the dynamic compensation system 100 includes a highly integrated programmable DSP module 102 and an analog low pass filter 104. For example, the DSP module 102 may comprise a digital signal processor such as the TMS320F2812 Digital Signal Processor manufactured by Texas Instruments® Inc., Dallas, Tex., USA. The TMS320F2812 DSP device is described in the TMS320F2810, TMS320F2811, TMS320F2812, TMS320C2810, TMS320C2811, TMS320C2812 Digital Signal Processors Data Manual, Literature Number: SPRS174J, April 2001—Revised July 2003, which is incorporated herein by reference. It is understood, however, that the DSP module 102 may alternatively comprise any other suitable DSP device.

Specifically, the programmable DSP module 102 comprises a DSP core (CPU), at least one event manager module including a PWM waveform generator, and an ADC module. As shown in FIG. 1, the DSP module 102 is operative to provide a selected PWM waveform output signal ranging from 0 to $+V_S$ volts to the low pass filter 104 over a line 106. The low pass filter 104 receives the unipolar PWM output signal, and provides a low pass filtered PWM (DC) signal to the DSP module 102 over a line 108. Because the DSP module 102 may be programmed to provide selected PWM output signals to the low pass filter 104, the filtered PWM signal produced by the low pass filter 104 comprises a controlled DC output voltage, which may be applied to the low reference voltage input of the ADC module for dynamically compensating for ADC zero level offset errors. It is understood that in an alternative embodiment, the low pass filter 104 may be incorporated within the waveform generator of the DSP module 102.

Figure 2:
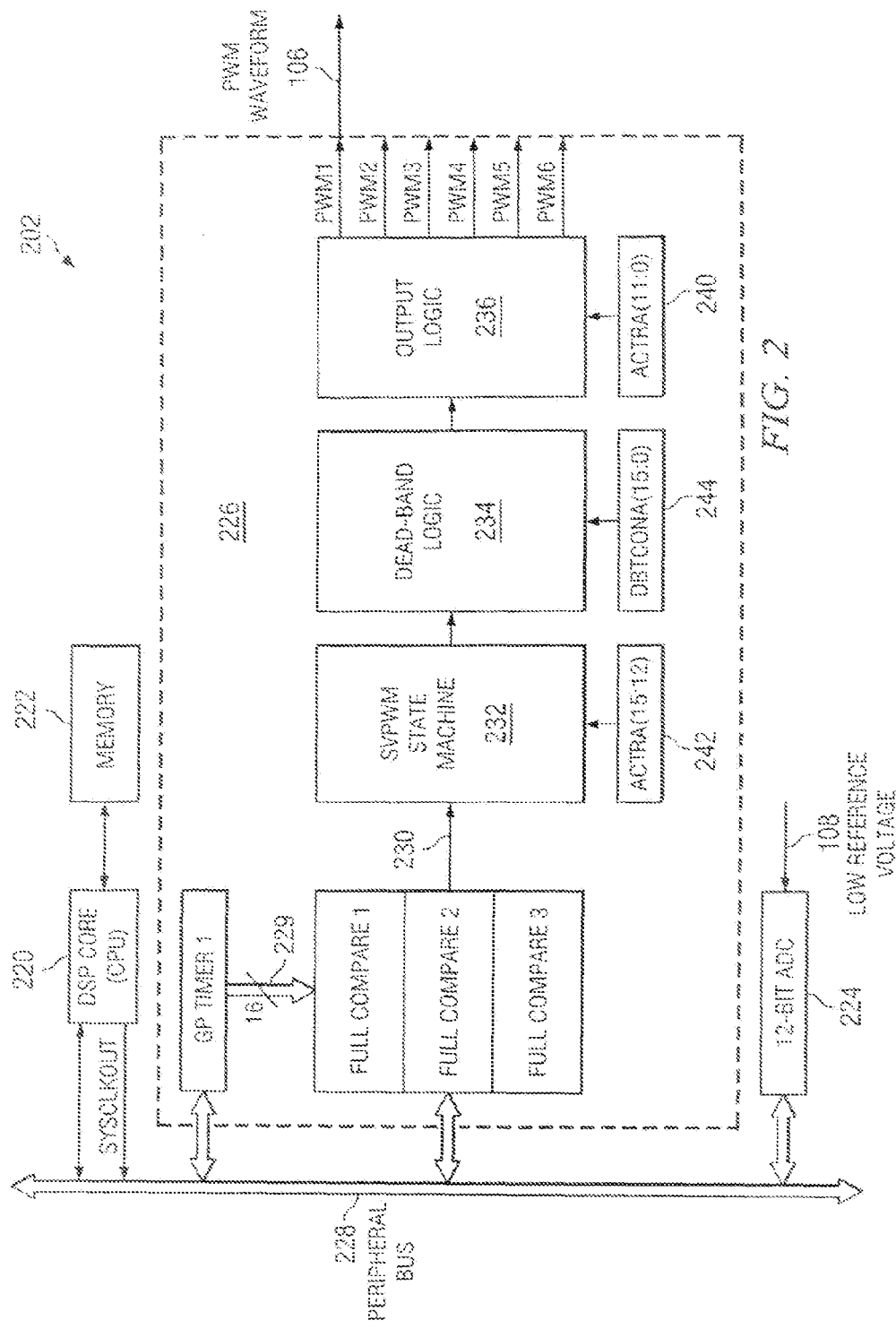
FIG. 2 is a block diagram of a digital signal processor module included in the dynamic compensation system of FIG. 1.

FIG. 2 depicts a detailed view 202 of the DSP module 102 included in the dynamic compensation system 100 of FIG. 1. As shown in FIG. 2, the DSP module 202 includes a DSP core (CPU) 220, a memory 222, a multi-bit ADC module 224, an event manager module 226, and an interface bus 228. The DSP core 220, the event manager module 226, and the ADC module 224 are connected to the interface bus 228 by respective buses. Specifically, the event manager module 226 is connected to the interface bus 228 via a general purpose timer (GP Timer 1) and a plurality of full compare units, e.g., Full Compare units 1–3. The DSP core 220 is also connected to the memory 222, which comprises ROM and/or RAM for storing data and one or more digital controller software applications executable by the DSP core. Moreover, the DSP core 220 is operative to apply a system clock signal (SYSCLKOUT) to the interface bus 228.

In the illustrated embodiment, the event manager module 226 comprises the PWM waveform generator, which includes the GP Timer 1, the Full Compare units 1–3, a state machine 232, dead-band logic 234, and output logic 236. The GP Timer 1 is a multi-bit timer that provides a multi-bit output signal on a bus 229 to the Full Compare units 1–3. The three Full Compare units 1–3 are configured to employ the GP Timer 1 output as a time base, and to provide suitable outputs on a bus 230 for subsequent generation of a plurality of PWM waveforms, i.e., waveforms PWM1–PWM6.

In the presently disclosed embodiment, the state machine 232, the dead-band logic 234, and the output logic 236 are programmed to provide the waveforms PWM1–PWM6 generated by the Full Compare units 1–3 substantially unchanged to respective pins (not numbered) of the DSP device. In an alternative embodiment, the state machine 232, the dead-band logic. 234, and the output logic 236 may be programmed for further controlling the state and/or the polarity of each of the six PWM output channels. The Full Compare units 1–3 include doubled-buffered compare registers (not shown) to facilitate programming of the PWM1–PWM6 pulse widths.

The DSP core 220 is configured to load suitable values into the compare registers of the Full Compare units 1–3 using data stored in the memory 222, and to load and start the GP Timer 1 and the dead-band logic 234. The DSP core 220 may further be configured to set a first action control register (ACTRA) 240 to control the polarity of the PWM1–PWM6 outputs via the output logic 236, to set a second action control register (ACTRA) 242 to provide suitable register and direction bits for enabling the state machine 232, and to set a dead-band control register (DBT-CONA) 244 to set up suitable values of the dead-band logic 234. The start and the end of each PWM1–PWM6 pulse are defined by the period value of the GP Timer 1.

As described above, the waveforms PWM1–PWM6 are provided to respective pins (not numbered) of the DSP device. The line 106 (see also FIG. 1) may be connected to a selected one of the pins to provide a suitable PWM waveform to the low pass filter 104 (see FIG. 1). It should be appreciated that the line 106 is depicted in FIG. 2 as being connected to the pin corresponding to the waveform PWM1 for purposes of illustration.

The DSP core 220 is operative to detect or measure the zero level offset of the multi-bit ADC module 224, and to dynamically control the characteristics of the selected PWM waveform based on the measured zero level offset. As described above, the characteristics of the selected PWM waveform include the PWM pulse width. The low pass filter 104 filters the PWM waveform provided to it via the line 106 (see FIG. 1), and provides the filtered PWM (DC) signal to the low reference voltage input of the ADC module 224, thereby reducing or eliminating the ADC zero level offset. It is appreciated that because the PWM output provided by the PWM waveform generator 226 is a positive voltage (e.g., 0 volts to +3.0 volts), directly filtering the PWM output by the low pass filter 104 produces a positive DC output voltage, which may be employed to compensate for positive ADC zero level offset errors.

Figure 3:
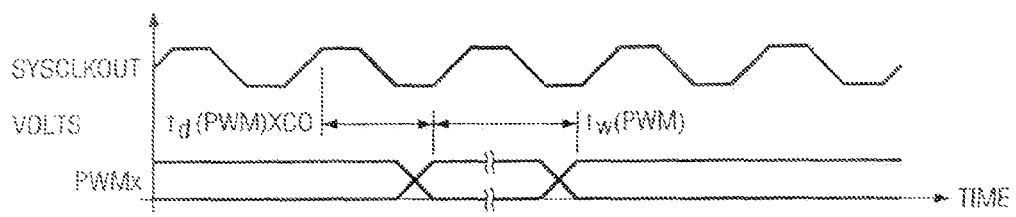
FIG. 3 is a timing diagram illustrating PWM output timing produced by the digital signal processor module of FIG. 2.

FIG. 3 depicts the timing of a waveform PWMx (x=1,2, 3,4,5, or 6) produced by the PWM waveform generator 226 (see FIG. 2). As shown in FIG. 3, the waveform PWMx is depicted relative to the system clock (SYSCLKOUT) of the DSP module 202. In the illustrated embodiment, the PWM pulse width ($t_{w(PWM)}$, PWMx output high/low) has a minimum value of 25 nsec. Further, the delay time ($t_{d(PWM)}$, SYSCLKOUT high to PWMx output switching) has a maximum value of 10 nsec. It is noted that further structural and operational details of the components of the DSP module are included in the above-referenced TMS320F2810, TMS320F2811, TMS320F2812, TMS320C2810, TMS320C2811, TMS320C2812 Digital Signal Processors Data Manual.

In the event a negative DC output voltage is required to compensate for a negative ADC zero level offset error, the unipolar PWM output produced by the PWM waveform generator may be converted to a bipolar PWM output, which may subsequently be provided to a low pass filter to produce the desired negative DC output voltage.

Figure 4:
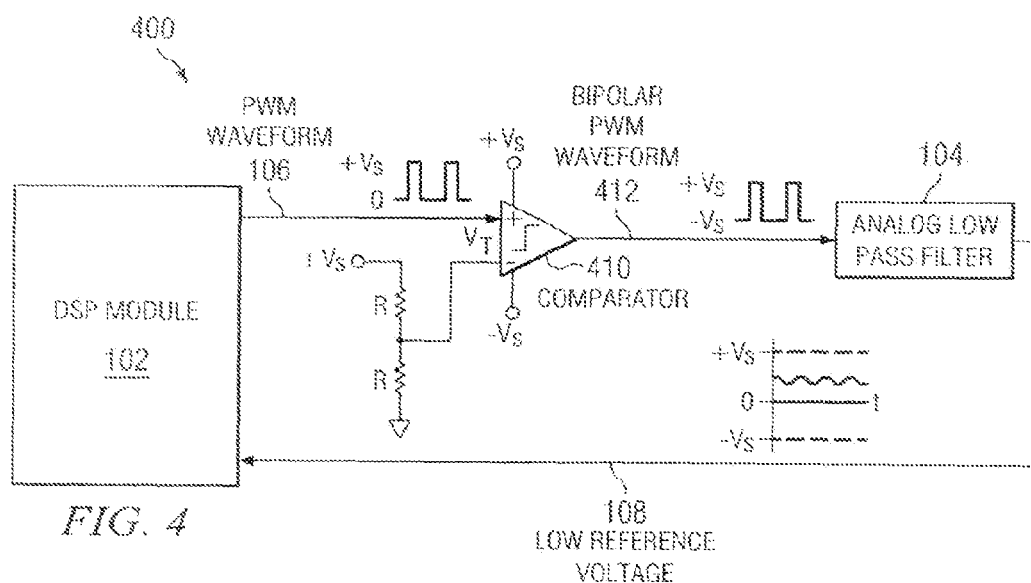
FIG. 4 is a block diagram of a first alternative embodiment of the dynamic compensation system of FIG. 1.

FIG. 4 depicts a dynamic compensation system 400 including the programmable DSP module 102, the low pass filter 104, and a comparator 410 for producing a bipolar PWM output. As described above, the DSP module 102 comprises the DSP core (CPU), at least one event manager module including the PWM waveform generator, and the ADC module. The DSP module 102 is operative to provide a selected PWM waveform output signal ranging from 0 to $+V_S$ volts to the comparator 410 over the line 106, and the comparator 410 is operative to provide a bipolar PWM output signal ranging from $-V_S$ to $+V_S$ volts corresponding to the unipolar PWM waveform to the low pass filter 104 over a line 412. For example, based on the value of an applied threshold voltage $V_T$ (which may be derived from a suitable voltage divider circuit; see FIG. 4), the comparator 410 may produce a positive output signal level (e.g., at voltage level $+V_S$) or a negative output signal level (e.g., at voltage level $-V_S$). The low pass filter 104 receives the bipolar PWM output signal, and provides a low pass filtered PWM (DC) signal (either positive or negative, depending on the duty cycle of the bipolar PWM output signal) to the DSP module 102 over the line 108.

In the event the comparator 410 provides a bipolar PWM output signal of less than 50% duty cycle to the low pass filter 104, the low pass filter 104 filters the bipolar PWM signal to produce a negative DC output voltage, which is applied to the low reference voltage input of the ADC module 224 to compensate for negative ADC zero level offset errors. In the event the comparator 410 provides a bipolar PWM output signal of greater than or equal to 50% duty cycle to the low pass filter 104, the low pass filter 104 filters the bipolar PWM signal to produce a positive DC output voltage, which is applied to the low reference voltage input of the ADC module 224 to compensate for positive ADC zero level offset errors. It is understood that in an alternative embodiment, the comparator 410 and/or the low pass filter 104 may be incorporated within the waveform generator of the DSP module 102.

Figure 5:
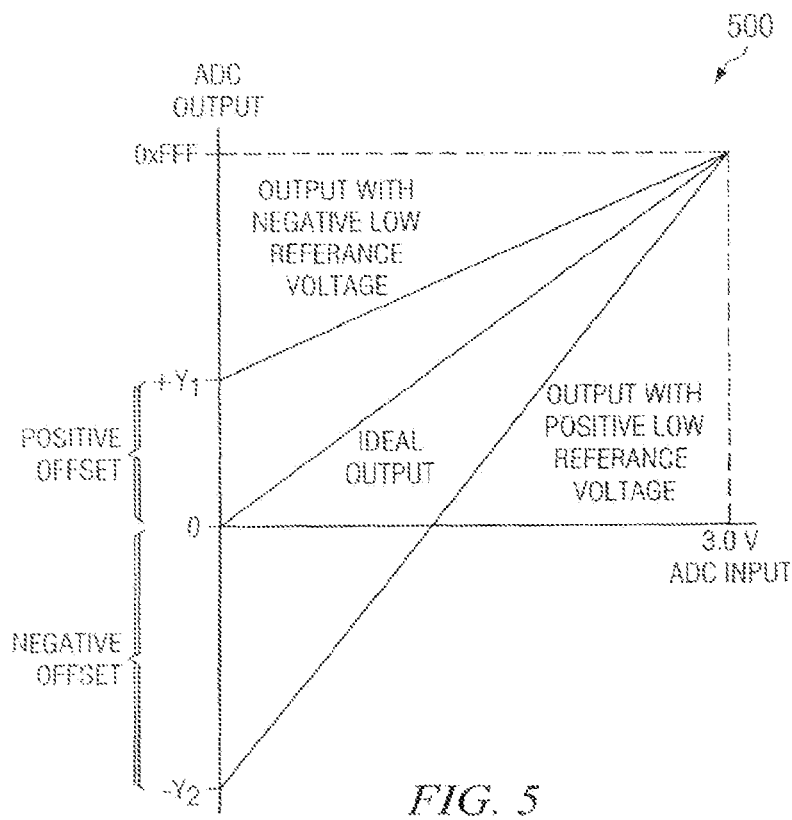
FIG. 5 is a diagram illustrating how the dynamic compensation system of FIG. 1 corrects for positive and negative offset errors.

FIG. 5 is a diagram depicting the output versus the input of an illustrative ADC module such as the ADC module 224 (see FIG. 2). Specifically, the diagram of FIG. 5 depicts a first ideal ADC output, a second ADC output corresponding to a negative low reference voltage applied to the ADC module, and a third ADC output corresponding to a positive low reference voltage applied to the ADC module. With respect to the ideal output, an ADC input voltage of 0 volts produces an ADC output voltage of 0 volts, and an ADC input voltage of 3.0 volts produces an ADC output voltage of 0xFFF. With respect to the output corresponding to an applied negative low reference voltage, an ADC input voltage of 0 volts produces an ADC output voltage of $+Y_1$ volts (positive zero level offset), and an ADC input voltage of 3.0 volts produces an ADC output voltage of 0xFFF. With respect to the output corresponding to an applied positive low reference voltage, an ADC input voltage of 0 volts produces an ADC output voltage of $-Y_2$ volts (negative zero level offset), and an ADC input voltage of 3.0 volts produces an ADC output voltage of 0xFFF.

It is noted that the low reference voltage applied to the ADC module can affect both offset and gain. As shown in FIG. 5, the applied positive low reference voltage shifts the range of the offset error in the negative direction along the ADC output axis, and the applied negative low reference voltage shifts the offset error range in the positive direction along the ADC output axis. As a result, a suitable positive low reference voltage may be employed to correct for positive zero level offset errors, and a suitable negative low reference voltage may be employed to correct for negative zero level offset errors. Moreover, the characteristics of the selected PWM waveform generated by the presently disclosed system may be dynamically controlled to reduce the range of the offset error.

Figure 6:
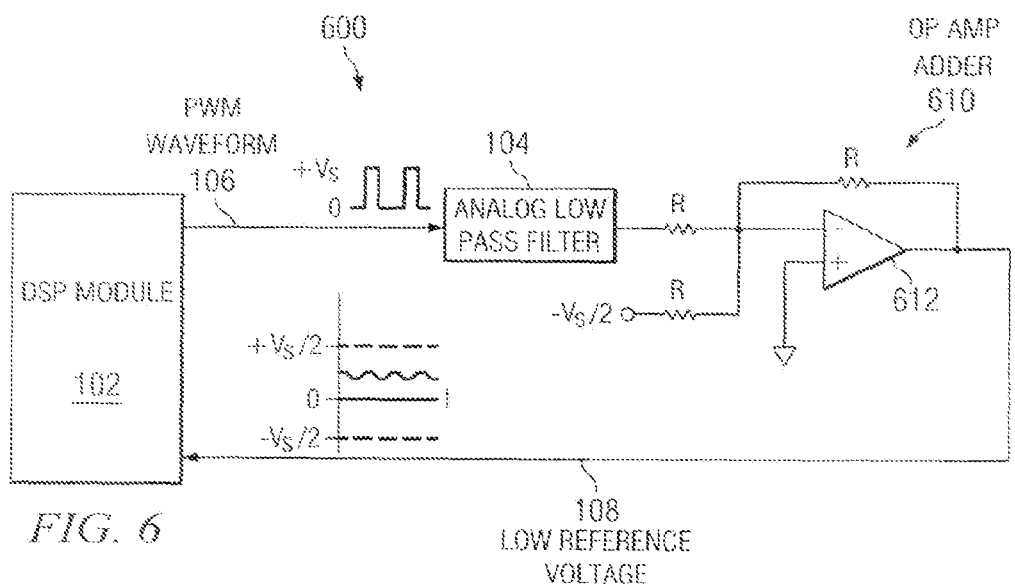
FIG. 6 is a block diagram of a second alternative embodiment of the dynamic compensation system of FIG. 1.

Having described the above illustrative embodiments, other alternative embodiments or variations may be made. For example, it was described that the dynamic compensation system may include the comparator 410 (see FIG. 4) for producing a bipolar PWM output. However, the configuration of the dynamic compensation system including the comparator 410 was described for purposes of illustration and other suitable configurations may be employed to produce the bipolar output. For example, FIG. 6 depicts an alternative embodiment of a dynamic compensation system 600 that employs an operational amplifier (op amp) voltage adder 610 instead of a comparator to produce a bipolar PWM output. As shown in FIG. 6, the dynamic compensation system 600 comprises the programmable DSP module 102, the low pass filter 104, and the op amp voltage adder 610, which includes an op amp 612, a suitable feedback resistor R, a suitable first input resistor R coupled between the low pass filter 104 and the negative input of the op amp 612, and a suitable second input resistor R coupled between the negative op amp input and a voltage level $-V_S/2$. The positive op amp input is connected to ground. The DSP module 102 is operative to provide a selected PWM waveform output signal ranging from 0 to $+V_S$ to the low pass filter 104 over the line 106, and the op amp voltage adder 610 is configured to provide a bipolar output signal ranging from $-V_S$ to $+V_S$ to the DSP module 102 over the line 108. It is understood that other suitable op amp voltage adder configurations may be employed. For example, the op amp voltage adder 610 may receive the PWM waveform directly from the DSP module 102, and the low pass filter 104 may be coupled to the output of the op amp voltage adder 610, thereby providing the filtered low reference voltage to the DSP module 102. It is understood that in an alternative embodiment, the low pass filter 104 and/or the op amp voltage adder 610 may be incorporated within the waveform generator of the DSP module 102.

In addition, it was described that the three Full Compare units 1–3 included in the DSP module 202 (see FIG. 2) provide for the generation of the waveforms PWM1–PWM6. However, the system configuration of FIG. 2 was described for purposes of illustration and other suitable configurations may be employed to generate the PWM waveforms. For example, a serial port (e.g., a multichannel buffered serial port; McBSP) and a Direct Memory Access (DMA) module may be employed to transmit a series of 1's and 0's. In this alternative configuration, a transmit data buffer is set up in DSP memory. Further, values written to the buffer are all 0's until a switching point occurs when the values switch to all 1's. The buffer is pre-loaded with the 0's and 1's. The DMA is configured for continuously writing the next word in the buffer to the McBSP transmit buffer, synchronized to the transmit buffer ready signal from the McBSP. The DMA is further configured to auto-initialize back to the beginning of the data buffer when the end of the buffer is reached. In this way, PWM-like signals can be generated by the McBSP without the need for continuous CPU involvement. Instead, the DSP CPU only needs to determine the proper values to write to the data buffer (e.g., to determine when the transition from 0 to 1 should occur) to produce the required PWM-like signal. The DSP can dynamically monitor the ADC offset, and adjust the data buffer as required. Such a configuration may be implemented, for example, on the C5000 and C6000 DSP families manufactured by Texas Instruments® Inc., Dallas, Tex., USA. The C5000 and C6000 DSP families include McBSP modules—they do not include PWM modules. The C5000 and C6000 DSP families also do not have integrated ADC modules and therefore offset compensation may be performed on an external ADC chip.

It will further be appreciated by those of ordinary skill in the art that modifications to and variations of the above-described dynamic compensation of Analog-to-Digital Converter (ADC) offset errors using filtered PWM may be made without departing from the inventive concepts disclosed herein. Accordingly, the invention should not be viewed as limited except as by the scope and spirit of the appended claims.

What is claimed is:

1. A system for providing dynamic compensation of analog-to-digital converter offset errors, comprising:
   an Analog-to-Digital Converter (ADC) having an analog input, a digital output, and at least one reference voltage input;
   a waveform generator operative to produce at least one output signal having Pulse-Width Modulated (PWM) waveform, the output signal having at least one predetermined PWM waveform characteristic;
   a low pass filter configured to receive the output signal having PWM waveform, to produce a corresponding signal, and to provide the corresponding signal to the reference voltage input of the ADC; and
   a processor operative to detect a voltage offset at the ADC digital output, and to control the predetermined waveform characteristic of the output signal based on the detected offset, thereby dynamically compensating for ADC offset errors.

2. The system of claim 1 wherein the at least one predetermined characteristic of the output signal is a pulse width.

3. The system of claim 1 wherein the output signal produced by the waveform generator is unipolar.

4. The system of claim 1 wherein the output signal produced by the waveform generator is bipolar.

5. The system of claim 4 wherein the waveform generator includes a comparator configured to produce the bipolar output signal.

6. The system of claim 5 wherein the comparator has a threshold voltage input, the comparator being configured to receive a first output signal, to produce the corresponding bipolar output signal based on a threshold voltage level applied to the threshold voltage input, and to provide the bipolar output signal to the low pass filter.

7. The system of claim 6 wherein the comparator is configured to produce a bipolar PWM output signal having PWM waveform characteristics of greater than or equal to 50% duty cycle, and wherein the low pass filter is configured to receive the bipolar PWM output signal, to produce a corresponding positive DC output signal, and to provide the positive DC output signal to the reference voltage input of the ADC, thereby compensating for positive ADC offset errors.

8. The system of claim 6 wherein the comparator is configured to produce a bipolar PWM output signal having PWM waveform characateristic of less than 50% duty cycle, and wherein the low pass filter is configured to receive the bipolar PWM output signal, to produce a corresponding negative DC output signal, and to provide the negative DC output signal to the reference voltage input of the ADC, thereby compensating for negative ADC offset errors.

9. The system of claim 4 wherein the waveform generator includes an op amp voltage adder configured to produce the bipolar output signal.

10. The system of claim 1 wherein the processor, the waveform generator, and the ADC are incorporated within a programmable digital signal processing device.

11. A method of providing dynamic compensation of analog-to-digital converter offset errors, comprising the steps of:

providing an Analog-to-Digital Converter (ADC) having an analog input, a digital output, and at least one reference voltage input;

producing at least one output signal having Pulse-Width Modulated (PWM) waveform, the output signal having at least one predetermined PWM waveform characteristic;

filtering the output signal having PWM waveform by a low pass filter to produce a corresponding signal;

providing the corresponding signal to the reference voltage input of the ADC;

detecting a voltage offset at the ADC digital output by a processor; and controlling the predetermined waveform characteristic of the output signal based on the detected offset, thereby dynamically compensating for ADC offset errors.

12. The method of claim 11 wherein the at least one predetermined characteristic of the output signal is a pulse width.

13. The method of claim 11 wherein the output signal produced by the waveform generator is unipolar.

14. The method of claim 11 wherein the output signal produced by the waveform generator is bipolar.

15. The method of claim 14 further including the steps of providing a comparator having a threshold voltage input, receiving the output signal having PWM waveform characteristic by the comparator, producing the corresponding bipolar output signal based on a threshold voltage level applied to the threshold voltage input by the comparator, and providing the bipolar output signal to the low pass filter.

16. The method of claim 15 further including the steps of producing a positive output signal having PWM waveform characteristic based on the threshold voltage level applied to the threshold voltage input by the comparator, receiving the positive output signal by the low pass filter, producing a corresponding positive DC output signal by the low pass filter, and providing the positive DC output signal to the reference voltage input of the ADC, thereby compensating for positive ADC offset errors.

17. The method of claim 15 further including the steps of producing a negative output signal having PWM waveform characteristic based on the threshold voltage level applied to the threshold voltage input by the comparator, receiving the negative output signal by the low pass filter, producing a corresponding negative DC output signal by the low pass filter, and providing the negative DC output signal to the reference voltage input of the ADC, thereby compensating for negative ADC offset errors.

18. The method of claim 14 further including the steps of receiving the output signal having PWM waveform characteristic by an op amp voltage adder, and producing the corresponding bipolar output signal by the op amp voltage adder.

19. The method of claim 18 further including the step of filtering the output signal having PWM waveform characteristics by a low pass filter.

20. The method of claim 11 further including the step of incorporating the processor, the waveform generator, and the ADC within a programmable digital signal processing device.

* * * * *